United States Patent
Huh et al.

(10) Patent No.: US 9,640,736 B2
(45) Date of Patent: May 2, 2017

(54) SILICON NANOCRYSTAL LIGHT EMITTING DIODE AND FABRICATING METHOD THEREOF

(71) Applicant: ELECTRONICS AND TELECOMMUNICATIONS RESEARCH INSTITUTE, Daejeon (KR)

(72) Inventors: Chul Huh, Daejeon (KR); Bong Kyu Kim, Daejeon (KR); Chang Geun Ahn, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 0 days.

(21) Appl. No.: 15/013,803

(22) Filed: Feb. 2, 2016

(65) Prior Publication Data

US 2016/0233369 A1 Aug. 11, 2016

(30) Foreign Application Priority Data

Feb. 6, 2015 (KR) .................. 10-2015-0018695

(51) Int. Cl.
| | | |
|---|---|---|
| H01L 29/06 | (2006.01) | |
| H01L 21/00 | (2006.01) | |
| H01L 33/50 | (2010.01) | |
| H01L 33/26 | (2010.01) | |

(52) U.S. Cl.
CPC ............ *H01L 33/502* (2013.01); *H01L 33/26* (2013.01)

(58) Field of Classification Search
CPC .............................. H01L 33/32; H01L 31/125

USPC .................................................. 257/9; 438/46
See application file for complete search history.

(56) References Cited

U.S. PATENT DOCUMENTS

| | | |
|---|---|---|
| 6,773,946 B2 | 8/2004 | Moon et al. |
| 6,998,643 B2 | 2/2006 | Kim et al. |
| 8,222,055 B2 | 7/2012 | Kim et al. |
| 2010/0048002 A1* | 2/2010 | Kim ................ C23C 16/30 438/503 |
| 2012/0141327 A1* | 6/2012 | Huh ................. G01N 21/7703 422/69 |

(Continued)

FOREIGN PATENT DOCUMENTS

| | | |
|---|---|---|
| KR | 10-0507610 B1 | 8/2005 |
| KR | 10-0833489 B1 | 5/2008 |
| WO | WO 2007/097500 A1 | 8/2007 |

OTHER PUBLICATIONS

Nenad Lalic et al., "Light emitting diode structure based on Si nanocrystals formed by implantation into thermal oxide", Journal of Luminescence, 1999, pp. 263-267, vol. 80, Elsevier Science B.V.

(Continued)

*Primary Examiner* — Igwe U Anya

(57) ABSTRACT

Disclosed is a silicon nano crystal light emitting diode, including: a photoelectric conversion layer formed of a silicon nitride layer including a silicon nano crystal; an electron injection layer formed on the photoelectric conversion layer; and a hole injection layer, which faces the electron injection layer with the photoelectric conversion layer interposed therebetween, has an energy band gap higher than that of the photoelectric conversion layer, and has a refractive index lower than that of a silicon thin film.

11 Claims, 2 Drawing Sheets

(56) References Cited

U.S. PATENT DOCUMENTS

| | | | |
|---|---|---|---|
| 2013/0154040 A1* | 6/2013 | Huh | H01L 31/02325 257/431 |
| 2013/0206202 A1* | 8/2013 | Lee | H01L 31/055 136/244 |
| 2016/0231879 A1* | 8/2016 | Sirpal | H04L 51/046 |
| 2016/0315134 A1* | 10/2016 | Nishido | H01L 27/3276 |

OTHER PUBLICATIONS

A. Fojtik et al., "Electroluminescence of silicon nanocrystals in p—i—n diode structures", Thin Solid Films, 2006, pp. 775-777, vol. 515, Elsevier B.V.

\* cited by examiner

SILICON NANOCRYSTAL LIGHT EMITTING DIODE AND FABRICATING METHOD THEREOF

CROSS-REFERENCE TO RELATED APPLICATION

This application claims priority to and the benefit of Korean Patent Application No. 10-2015-0018695, filed on Feb. 6, 2015, in the Korean Intellectual Property Office, the entire contents of which are incorporated herein by reference in their entirety.

BACKGROUND

1. Field

The present disclosure relates to a light emitting diode, and a method of manufacturing the same, and particularly, to a silicon nano crystal light emitting diode, and a method of manufacturing the same.

2. Description of the Related Art

When silicon has a nano-size, an energy band structure may have a direct transition type band structure, which is similar to an energy band structure of a compound semiconductor. Since a silicon nano crystal has the direct transition type band structure, it is possible to manufacture a highly efficient light source by using a quantum confinement effect of the silicon nano crystal.

In general, the silicon nano crystal is formed within a silicon oxide layer (SiOx). However, when the silicon oxide layer is used for forming the silicon nano crystal, a heat treatment at a high temperature exceeding 1,000° C. needs to be essentially performed. Further, since interfacial defects are generated between the silicon oxide layer and the silicon nano crystal, it is difficult to manufacture a highly efficient light source and a light source having various wavelengths within a visible ray region through the silicon nano crystal formed within the silicon oxide layer.

In the meantime, when a silicon nitride layer SiNx is used for forming the silicon nano crystal, it is possible to simultaneously form the silicon nano crystal within the silicon nitride layer when the silicon nitride layer is grown. Accordingly, when the silicon nano crystal is formed by using the silicon nitride layer, a heat treatment at a high temperature is not required. Further, since the silicon nitride layer has a small energy band gap than that of the silicon oxide layer, it is easy to inject a current into a photoelectric conversion layer including a nano crystal from an external electrode. Further, since a defect between an interface between the silicon nitride layer and the silicon nano crystal is small, a loss of electrons and holes is small, thereby manufacturing a highly-efficient light source. As described above, the light source using the silicon nano crystal formed within the silicon nitride layer has various advantages, so that research on the light source has been actively conducted.

In general, when a silicon nano crystal light emitting diode is fabricated, the photoelectric conversion layer including the silicon nano crystal is grown on a silicon substrate. Further, a wavelength region of light emitted from the silicon nano crystal light emitting diode has a wavelength band of a visible ray region. Most of the light having a wavelength in a visible ray region emitted from the photoelectric conversion layer of the silicon nano crystal light emitting diode is absorbed in the silicon substrate, so that there is a disadvantage in that light efficiency of the light emitting diode deteriorates. Accordingly, a method of effectively extracting light generated within the photoelectric conversion layer including the silicon nano crystal to the outside of the diode has been demanded.

SUMMARY OF THE INVENTION

The present disclosure has been made in an effort to solve the above-described problems associated with the prior art, and provides a silicon nano crystal light emitting diode, which is capable of improving light emission efficiency by increasing a light quantity emitted from the inside to the outside of a photovoltaic conversion layer, and a method of fabricating the same.

An exemplary embodiment of the present disclosure provides a silicon nano crystal light emitting diode, including: a photoelectric conversion layer formed of a silicon nitride layer including a silicon nano crystal; an electron injection layer formed on the photoelectric conversion layer; and a hole injection layer, which faces the electron injection layer with the photoelectric conversion layer interposed therebetween, has an energy band gap higher than that of the photoelectric conversion layer, and has a refractive index lower than that of a silicon thin film.

The hole injection layer may be formed of a p-type nitride semiconductor thin film.

The nitride semiconductor thin film may include any one of GaN, AlN, InN, AlGaN, InGaN, InAlN, and InAlGaN.

The electron injection layer may be formed of an n-type silicon carbide thin film.

The silicon carbide thin film may include SiC or SiCN.

The silicon nano crystal light emitting diode may further include a transparent electrode formed on the electron injection layer.

The silicon nano crystal light emitting diode may further include an upper electrode formed on the transparent electrode; and a lower electrode formed under the hole injection layer.

Another exemplary embodiment of the present disclosure provides a method of fabricating a silicon nano crystal light emitting diode, including: forming a hole injection layer, which has a smaller refractive index than that of a silicon thin film, and has an energy band gap passing through visible rays; forming a photoelectric conversion layer of a silicon nitride layer including a silicon nano crystal on the hole injection layer; and forming an electron injection layer on the photoelectric conversion layer.

The hole injection layer may be formed of a material having a higher energy band gap than that of the photoelectric conversion layer.

The forming of the photoelectric conversion layer may include forming the silicon nano crystal within the silicon nitride layer by using a plasma enhanced chemical vapor deposition method.

According to the exemplary embodiment of the present disclosure, it is possible to provide the highly efficient light emitting diode by forming the hole injection layer formed on at least one surface of the photoelectric conversion layer including the silicon nano crystal so as for light incident into the photoelectric conversion layer to be easily discharged to the outside of the light emitting diode.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION OF THE INVENTION

Figure 1:
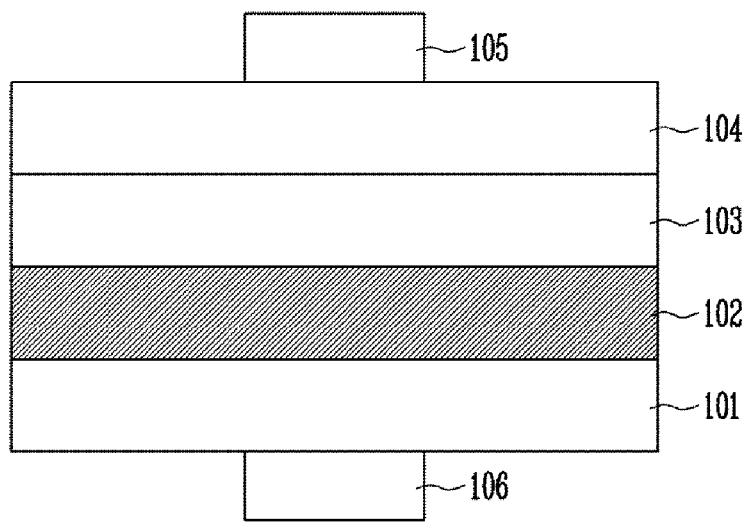
FIG. 1 is a cross-sectional view for describing a silicon nano crystal light emitting diode according to an exemplary embodiment of the present disclosure, and a method of fabricating the same.

Hereinafter, an exemplary embodiment of the present disclosure will be described in detail with reference to the accompanying drawings. However, the present disclosure is not limited to the exemplary embodiments disclosed below, but may be variously implemented in different forms, and the scope of the present disclosure is not limited to the exemplary embodiments to be described below. However, the exemplary embodiments are provided to complete the disclosure of the present disclosure and be completely known to those skilled in the art, and the scope of the present disclosure should be understood by the claims. Sizes or thickness of the thin films in the drawings are exaggerated for convenience of the description.

In the description below, a silicon nano crystal is defined as a crystal having a diameter of 1 nm to 20 nm.

FIG. 1 is a cross-sectional view for describing a silicon nano crystal light emitting diode according to an exemplary embodiment of the present disclosure, and a method of fabricating the same.

Referring to FIG. 1, the silicon nano crystal light emitting diode may include a hole injection layer 101, a photoelectric conversion layer 102, an electron injection layer 103, and a transparent electrode 104, which are sequentially laminated. Further, the silicon nano crystal light emitting diode may further include a lower electrode 106 formed under the hole injection layer 101 and an upper electrode 105 formed on the transparent electrode 104.

The hole injection layer 101 may be a silicon substrate. More particularly, the hole injection layer 101 may be p-type silicon substrate.

The photoelectric conversion layer 102 is a light emitting layer, and may be formed by depositing a silicon nitride layer (SiNx, x is a natural number) including a silicon nano crystal on the hole injection layer 101 by a plasma-enhanced chemical vapor deposition method.

The electron injection layer 103 may be formed on the photoelectric conversion layer 102, and may be formed of an n-type silicon carbide thin film. For example, a silicon carbide-based material includes SiC and SiCn.

The transparent electrode 104 may be formed of a material, such as an Indium tin oxide (ITO), $SnO_2$, $In_2O_3$, $Cd_2SnO_4$, and ZnO.

Each of the upper electrode 105 and the lower electrode 106 is formed of a conductive material, and may be formed of a metal, for example, nickel (Ni), aluminum (Al), platinum (Pt), palladium (Pd), titanium (Ti), and gold (Au). A current is injected into the transparent electrode 104 and the hole injection layer 102 through the upper electrode 105 and the lower electrode 106, and electrons and holes are injected into the photoelectric conversion layer 102, so that light is radiated. Accordingly, in the exemplary embodiment of the present disclosure, it is possible to implement a light emitting diode using the silicon nitride layer including the silicon nano crystal as the photoelectric conversion layer 102.

Figure 2:
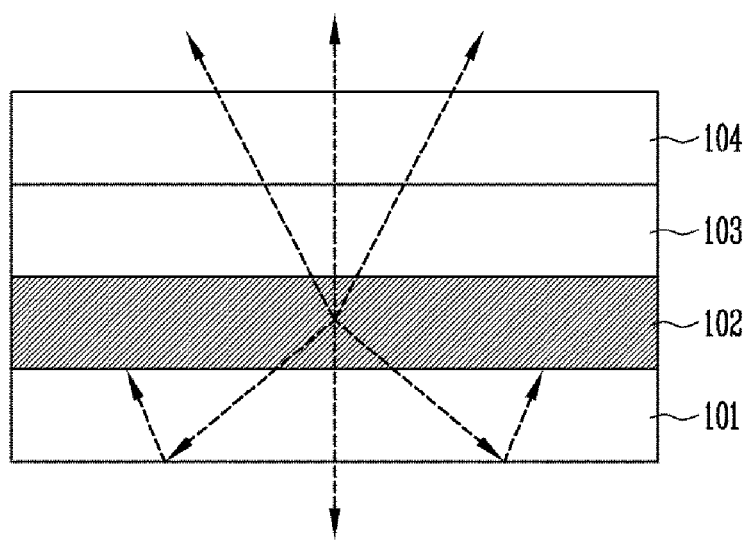
FIG. 2 is a cross-sectional view illustrating a path of light generated and emitted from a photoelectric conversion layer illustrated in FIG. 1.

FIG. 2 is a cross-sectional view illustrating a path of light generated and radiated from the photoelectric conversion layer illustrated in FIG. 1.

The photoelectric conversion layer 102 is formed of the silicon nitride layer including the silicon nano crystal. The light generated from the photoelectric conversion layer 102 is absorbed in the light emitting diode or emitted to the outside of the light emitting diode by an refractive index of each thin film configuring the light emitting diode.

For example, when the light incident into the hole injection layer 101, which is formed of the silicon substrate, from the photoelectric conversion layer 102, has an incident angle equal to or larger than a specific threshold angle, the light is reflected from an interface of the hole injection layer 101 and cannot be discharged to the outside of the light emitting diode. The threshold angle, at which the light is reflected, may be changed by refractive indexes of the photoelectric conversion layer 102 and the hole injection layer 101. The photoelectric conversion layer 102 according to the exemplary embodiment of the present disclosure is a silicon nitride layer including the silicon nano crystal, and has a refractive index of about 2.5. The hole injection layer 101 according to the exemplary embodiment of the present disclosure is a silicon thin film, and has a refractive index of about 2.5.

Further, the hole injection layer 101 according to the exemplary embodiment of the present disclosure is a silicon thin film, and has an energy band gap of about 1.1 eV. The light generated in the photoelectric conversion layer 102 of the silicon nitride layer including the silicon nano crystal has an energy band gap having a wavelength of a visible ray region. Accordingly, the light, which is generated in the photoelectric conversion layer 102 and heads to the hole injection layer 101 formed of the silicon thin film, cannot be discharged to the outside of the light emitting diode and is absorbed in the hole injection layer 101, which is the silicon thin film.

Hereinafter, a structure for further improving light emission efficiency compared to the exemplary embodiment described with reference to FIGS. 1 and 2 will be described.

Figure 3:
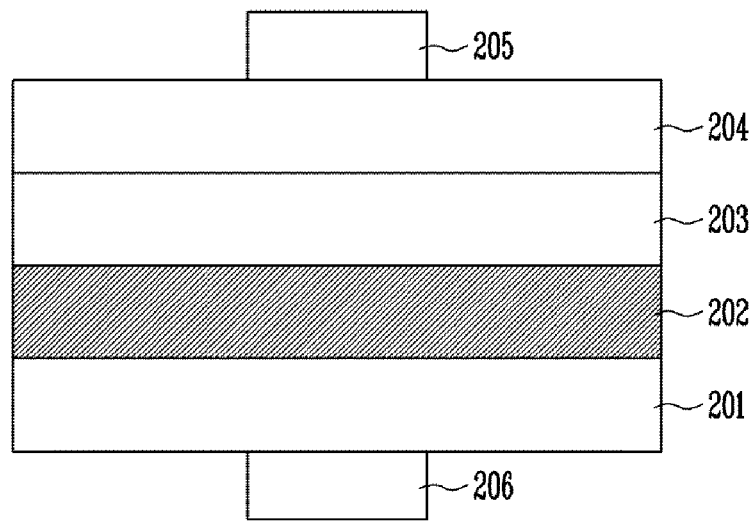
FIG. 3 is a cross-sectional view for describing a silicon nano crystal light emitting diode according to an exemplary embodiment of the present disclosure, and a method of fabricating the same.

FIG. 3 is a cross-sectional view for describing a silicon nano crystal light emitting diode according to an exemplary embodiment of the present disclosure, and a method of fabricating the same.

Referring to FIG. 3, the silicon nano crystal light emitting diode may include a hole injection layer 201, a photoelectric conversion layer 202, an electron injection layer 203, and a transparent electrode 204, which are sequentially laminated. Further, the silicon nano crystal light emitting diode may further include a lower electrode 206 formed under the hole injection layer 201 and an upper electrode 205 formed on the transparent electrode 204.

The hole injection layer 201 may be formed of a material having a reflection threshold angle larger than a reflection threshold angle in a silicon thin film so as to more efficiently discharge light radiated from the photoelectric conversion layer 202 to the outside. The hole injection layer 201 may be formed of a material, which is capable of decreasing an absorption rate of light having a wavelength of a visible ray region, compared to the silicon thin film. For example, the hole injection layer 201 may be a nitride semiconductor thin film. More particularly, the hole injection layer 201 may be a p-type nitride semiconductor thin film. The nitride semiconductor thin film may include GaN, AlN, InN, AlGaN, InGaN, InAlN, InAlGaN, and the like.

The photoelectric conversion layer 202 is a light emitting layer, and may be formed by depositing a silicon nitride layer (SiNx, x is a natural number) including a silicon nano crystal on the hole injection layer 201 by a plasma-enhanced chemical vapor deposition method.

The electron injection layer 203 may be formed on the photoelectric conversion layer 202, and may be formed of an n-type silicon carbide thin film. For example, a silicon carbide-based material includes SiC and SiCn.

The transparent electrode 204 may be formed of a material, such as an Indium tin oxide (ITO), $SnO_2$, $In_2O_3$, $Cd_2SnO_4$, and ZnO.

Each of the upper electrode 205 and the lower electrode 206 is formed of a conductive material, and may be formed of a metal, for example, nickel (Ni), aluminum (Al), platinum (Pt), palladium (Pd), titanium (Ti), and gold (Au). A current is injected into the transparent electrode 204 and the hole injection layer 202 through the upper electrode 205 and the lower electrode 206, and electrons and holes are injected into the photoelectric conversion layer 202 by the injected current. The electrons and holes injected into the photoelectric conversion layer 202 are combined to generate light. Accordingly, light is radiated from the photoelectric conversion layer 202. Accordingly, in the exemplary embodiment of the present disclosure, it is possible to implement a light emitting diode using the silicon nitride layer including the silicon nano crystal as the photoelectric conversion layer 202.

Figure 4:
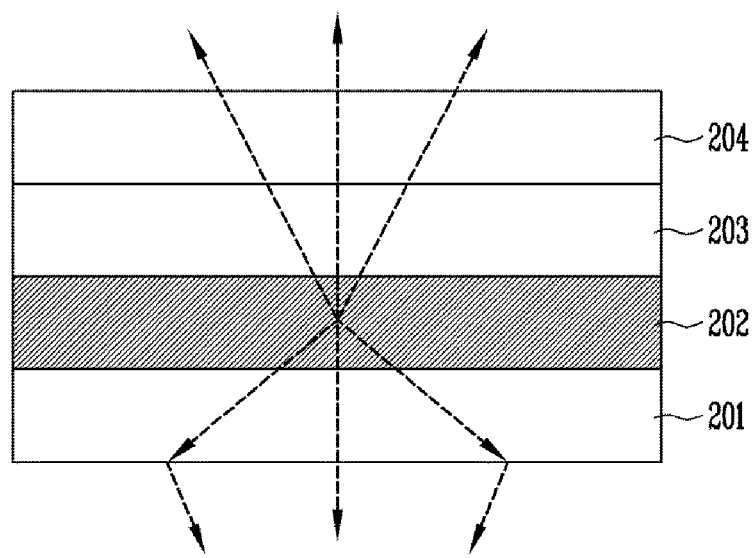
FIG. 4 is a cross-sectional view illustrating a path of light generated and emitted from a photoelectric conversion layer illustrated in FIG. 3.

FIG. 4 is a cross-sectional view illustrating a path of light generated and emitted from the photoelectric conversion layer illustrated in FIG. 3.

Referring to FIG. 4, the photoelectric conversion layer 4 is formed of the silicon nitride layer including the silicon nano crystal. The light generated from the photoelectric conversion layer 202 may pass through the electron injection layer 203 formed of the silicon carbide thin film and the transparent electrode 204 and may be discharged to the outside. Further, light incident into the hole injection layer 201 formed of the nitride semiconductor thin film from the photoelectric conversion layer 202 may be refracted on an interface of the hole injection layer 201. In this case, the light may be reflected according to an incident angle of the light incident into the hole injection layer 201. The threshold angle, at which the light is reflected, may be changed by refractive indexes of the photoelectric conversion layer 202 and the hole injection layer 201. The photoelectric conversion layer 202 in the exemplary embodiment of the present disclosure is the silicon nitride layer including the silicon nano crystal, which is identical to that in the exemplary embodiment illustrated in FIGS. 1 and 2, and has a refractive index of about 2.5. In the exemplary embodiment of the present disclosure, the hole injection layer 201 is a nitride semiconductor thin film and has a refractive index of about 2.5. That is, the hole injection layer 201 of the nitride semiconductor thin film has a refractive index smaller than that of the hole injection layer 101 of the silicon thin film illustrated in FIGS. 1 and 2. Accordingly, a threshold angle of the hole injection layer 201 of the nitride semiconductor thin film is smaller than the threshold angle of the hole injection layer 101 of the silicon thin film. As a result, the light incident from the photoelectric conversion layer 202 to the hole injection layer 201 may be more efficiently discharged to the outside of the light emitting diode compared to the exemplary embodiment illustrated in FIGS. 1 and 2.

Further, the hole injection layer 201 according to the exemplary embodiment of the present disclosure is a nitride semiconductor thin film, and has an energy band gap larger than an energy band gap of the photoelectric conversion layer 202. Accordingly, the light, which is generated in the photoelectric conversion layer 202 of the silicon nitride layer including the silicon nano crystal and has the wavelength of the visible ray region, passes through the hole injection layer 201 formed of the nitride semiconductor thin film, and an absorption quantity of the light in the hole injection layer 201 is slight. As a result, the light incident from the photoelectric conversion layer 202 to the hole injection layer 201 may be more efficiently discharged to the outside of the light emitting diode compared to the exemplary embodiment illustrated in FIGS. 1 and 2.

As described above, according to the exemplary embodiment of the present disclosure, when the light emitting diode is implemented by using the silicon nano crystal, the nitride semiconductor thin film is disposed on one surface of the photoelectric conversion layer 202 including the silicon nano crystal, so that it is possible to decrease the internal absorption quantity and the reflection quantity of the light generated from the photoelectric conversion layer 202. Accordingly, according to the exemplary embodiment of the present disclosure, it is possible to provide the highly efficient silicon nano crystal light emitting diode by improving efficiency of the light emitting diode by increasing the light quantity emitted to the to the outside of the light emitting diode.

As described above, even though the disclosure made by the inventor has been described in detail with the exemplary embodiment, it is apparent that the present disclosure is not limited to the exemplary embodiment, but various modifications and changes may be made without departing from the main principle of the present disclosure.

What is claimed is:

1. A silicon nano crystal light emitting diode, comprising:
a photoelectric conversion layer formed of a silicon nitride layer including a silicon nano crystal;
an electron injection layer formed on the photoelectric conversion layer; and
a hole injection layer, which faces the electron injection layer with the photoelectric conversion layer interposed therebetween, has an energy band gap higher than that of the photoelectric conversion layer, and has a refractive index lower than that of a silicon thin film,
wherein the hole injection layer is formed of a p-type nitride semiconductor thin film, and
wherein the nitride semiconductor thin film includes any one of GaN, AlN, InN, AlGaN, InGaN, InAlN, and InAlGaN.

2. The silicon nano crystal light emitting diode of claim 1, wherein the electron injection layer is formed of an n-type silicon carbide thin film.

3. The silicon nano crystal light emitting diode of claim 2, wherein the silicon carbide thin film includes SiC or SiCN.

4. The silicon nano crystal light emitting diode of claim 1, further comprising:
a transparent electrode formed on the electron injection layer.

5. The silicon nano crystal light emitting diode of claim 1, further comprising:
an upper electrode formed on the transparent electrode; and
a lower electrode formed under the hole injection layer.

6. A method of fabricating a silicon nano crystal light emitting diode, comprising:
forming a hole injection layer, which has a smaller refractive index than that of a silicon thin film, and has an energy band gap passing through visible rays;
forming a photoelectric conversion layer of a silicon nitride layer including a silicon nano crystal on the hole injection layer; and
forming an electron injection layer on the photoelectric conversion layer,
wherein the hole injection layer is formed of a p-type nitride semiconductor thin film, and
wherein the nitride semiconductor thin film includes any one of GaN, AlN, InN, AlGaN, InGaN, InAlN, and InAlGaN.

7. The method of claim 6, wherein the hole injection layer is formed of a material having a higher energy band gap than that of the photoelectric conversion layer.

8. The method of claim 6, wherein the forming of the photoelectric conversion layer includes forming the silicon nano crystal within the silicon nitride layer by using a plasma enhanced chemical vapor deposition method.

9. The method of claim 6, wherein the electron injection layer is formed of an n-type silicon carbide thin film.

10. The method of claim 9, wherein the silicon carbide thin film includes SiC or SiCN.

11. The method of claim 6, further comprising:
forming a transparent layer on the electron injection layer.

* * * * *